United States Patent
Koo

(10) Patent No.: US 9,466,338 B1
(45) Date of Patent: Oct. 11, 2016

(54) PULSE GENERATOR, MEMORY DEVICE, MEMORY SYSTEM HAVING THE SAME, AND METHOD OF CONTROLLING AN INTERNAL POWER OF THE MEMORY DEVICE

(71) Applicant: SK hynix Inc., Icheon-si, Gyeonggi-do (KR)

(72) Inventor: Cher Hei Koo, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/955,282

(22) Filed: Dec. 1, 2015

(30) Foreign Application Priority Data

Jun. 24, 2015 (KR) .................. 10-2015-0089788

(51) Int. Cl.
G11C 7/10 (2006.01)
G11C 5/14 (2006.01)
H03K 5/24 (2006.01)
G11C 8/10 (2006.01)

(52) U.S. Cl.
CPC .............. *G11C 5/147* (2013.01); *G11C 7/10* (2013.01); *G11C 8/10* (2013.01); *H03K 5/2472* (2013.01)

(58) Field of Classification Search
CPC .......... G11C 7/10; G11C 8/10; H03K 5/2472
USPC .......... 365/189.09, 189.011, 189.17, 189.05, 365/189.07, 233.1
See application file for complete search history.

(56) References Cited

U.S. PATENT DOCUMENTS

2009/0109168 A1* 4/2009 Lee .................. G09G 3/3426
345/102

FOREIGN PATENT DOCUMENTS

KR 1020150016614 A 2/2015

* cited by examiner

*Primary Examiner* — Fernando Hidalgo
(74) *Attorney, Agent, or Firm* — William Park & Associates Ltd.

(57) ABSTRACT

A pulse generator may include a switching control circuit suitable for compare an internal power with a reference voltage and output a comparison enable signal according to a result of the comparison. The pulse generator may include a comparison circuit suitable for measure a data variation by comparing a current data group and a previous data group, and output pre-pulse data in response to the data variation and the comparison enable signal. The pulse generator may include a pulse control circuit suitable for output main pulse data by controlling a pulse width of the pre-pulse data.

22 Claims, 5 Drawing Sheets

PULSE GENERATOR, MEMORY DEVICE, MEMORY SYSTEM HAVING THE SAME, AND METHOD OF CONTROLLING AN INTERNAL POWER OF THE MEMORY DEVICE

CROSS-REFERENCE TO RELATED APPLICATION

The present application claims priority to Korean patent application number 10-2015-0089788 filed on Jun. 24, 2015, in the Korean Intellectual Property Office, the entire disclosure of which is incorporated by reference herein.

BACKGROUND

1. Technical Field

Various embodiments relate generally to a pulse generator, memory device, and a memory system having the same and, more particularly, to a memory device including a pulse generator and a data input/output circuit and a memory system having the same, and method of controlling an internal power of a memory device.

2. Related Art

A memory system may consist of a memory device for programming data in response to a command. The command can be received from a host for reading or erasing the programmed data. The memory system may consist of a control unit for controlling the memory device.

The memory device may consist of a memory cell array for storing data and a peripheral circuit for performing a program operation, a read operation and an erase operation on the memory cell array. The memory device may consist of a pulse generator suitable for controlling the peripheral circuit and an internal power supply circuit for providing an internal power. The internal power supply circuit may receive an external power and supply the internal power to the memory device by lowering the level of the external power.

Some circuits included in the memory device may operate using the internal power supplied by the internal power supply circuit.

DETAILED DESCRIPTION

Figure 1:
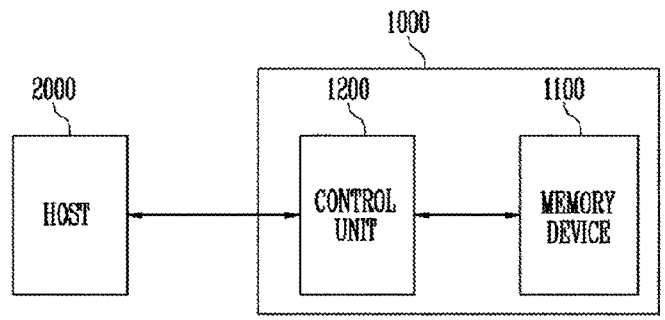
FIG. 1 is a schematic diagram illustrating a representation of an example of a memory system according to an embodiment.

In an embodiment, a pulse generator may be provided. The pulse generator may include a switching control circuit suitable for comparing an internal power with a reference voltage and output a comparison enable signal according to a result of the comparison. The pulse generator may include a comparison circuit suitable for measuring a data variation by comparing a current data group and a previous data group, and output pre-pulse data in response to the data variation and the comparison enable signal. The pulse generator may include a pulse control circuit suitable for outputting main pulse data by controlling a pulse width of the pre-pulse data.

In an embodiment, a memory device may be provided. The memory device may include a memory cell array suitable for storing data. The memory device may include a peripheral circuit suitable for performing a program operation, a read operation or an erase operation on the memory cell array and temporarily store a current data group and previous data groups. The memory device may include a pulse generator suitable for measuring a data variation by comparing the current data group with the previous data group and output a main pulse data with a pulse number and a pulse width controlled according to a data variation. The memory device may include an internal power supply circuit suitable for outputting an internal power according to the main pulse data.

In an embodiment, a memory system may be provided. The memory system may include a memory device suitable for converting an external power into an internal power, operate with the internal power and store data. The memory system may include a control unit suitable for controlling the memory device. The memory device may include a memory cell array suitable for storing the data. The memory device may include a peripheral circuit suitable for performing a program operation, a read operation or an erase operation on the memory cell array and may be suitable for temporarily storing a current data group and a previous data group. The memory device may include a pulse generator suitable for measuring a data variation by comparing the current data group with the previous data group and output main pulse data with a controlled pulse number and pulse width according to the data variation. The memory device may include an internal power supply circuit suitable for outputting the internal power according to the main pulse data.

In an embodiment, a memory device may be provided. The memory device may include a switching control circuit suitable for comparing an internal power with a reference voltage and output a comparison enable signal according to a result of the comparison. The memory device may include a comparison circuit suitable for measuring a data variation by comparing a current data group and a previous data group, and output pre-pulse data in response to the data variation and the comparison enable signal. The memory device may include a pulse control circuit suitable for outputting main pulse data by controlling a pulse width of the pre-pulse data. The memory device may include an internal power supply circuit suitable for outputting the internal power in response to the main pulse data.

In an embodiment, a method of controlling an internal power of a memory device is provided. The method may include comparing an internal power with a reference voltage and output a comparison enable signal according to a result of the comparison by a switching control circuit. The method may include measuring a data variation by comparing a current data group and a previous data group, and output pre-pulse data in response to the data variation and the comparison enable signal. The method may include outputting main pulse data by controlling a pulse width of the pre-pulse data. The method may include outputting the internal power in response to the main pulse data.

Hereinafter, various examples of embodiments will be described with reference to the accompanying drawings. The figures are provided to allow those with ordinary skill in the art to understand the scope of the embodiments. The embodiments may, however, be embodied in different forms and should not be construed as limited to the embodiments set forth. Rather, these embodiments are provided so that this disclosure will be thorough and complete. In addition, the embodiments are provided to fully convey the scope of the disclosure to those skilled in the art.

A stable internal power may be desired to maintain the reliability of a memory device because some of the circuits included in the memory device may operate using an internal power supplied by an internal power supply circuit.

Various embodiments may relate to a memory device to which an internal power may be stably provided although power consumption increases.

Various embodiments may relate to a memory system having a memory device to which an internal power may be stably provided although power consumption increases.

FIG. 1 is a schematic diagram illustrating a representation of an example of a memory system according to an embodiment.

Referring to FIG. 1, a memory system 1000 may include a memory device 1100 suitable for storing data and a control unit 1200 suitable for controlling the memory device 1100.

The memory device 1100 may include, for example but not limited to, Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM) or FLASH Memory, etc.

The control unit 1200 may generally control operations of the memory device 1100, a data exchange between a host 2000 and the memory device 1100, and the memory device 1100 for data to be programed upon the request of the host 2000.

The host 2000 may communicate with the memory system 1000 using an interface protocol such as, for example but not limited to, Peripheral Component Interconnect—Express (PCI-E), Advanced Technology Attachment (ATA), Serial ATA (SATA), Parallel ATA (PATA) or serial attached SCSI (SAS). Further, the interface protocol between the host 2000 and the memory system 1000 may be not limited to the above described examples, and may be one of other interface protocols such as, for example but not limited to, Universal Serial Bus (USB), Multi-Media Card (MMC), Enhanced Small Disk Interface (ESDI), or Integrated Drive Electronics (IDE), etc.

Figure 2:
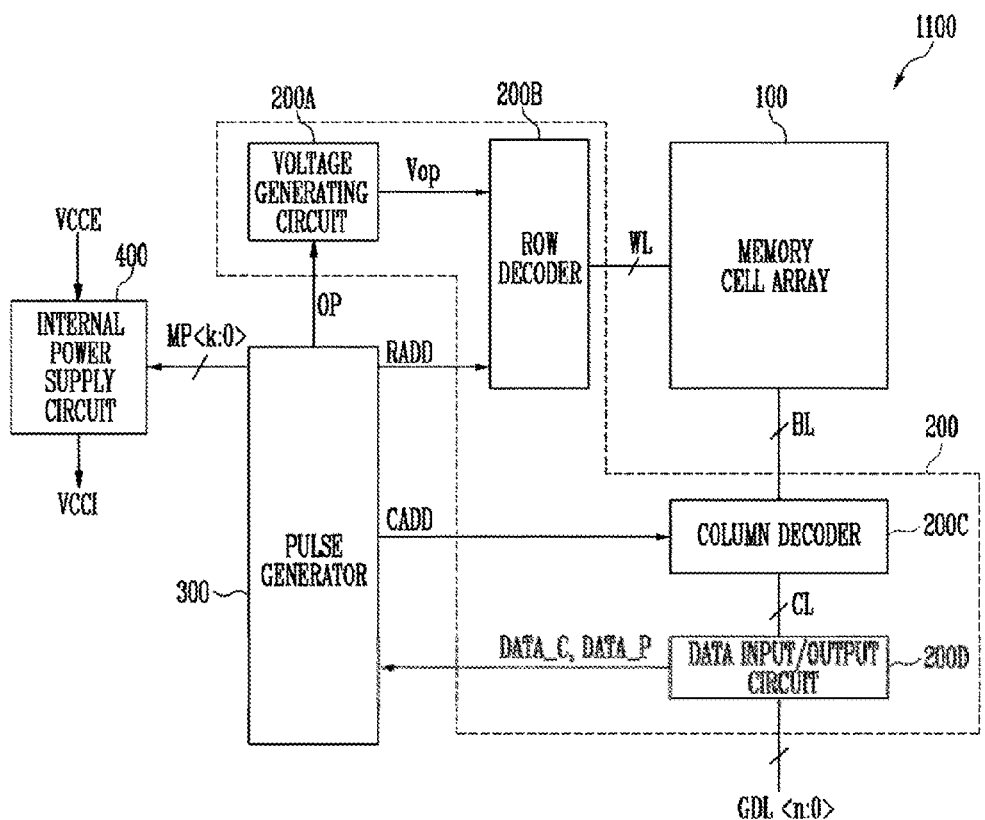
FIG. 2 is a diagram illustrating a representation of an example of a memory device according to an embodiment.

FIG. 2 is a diagram illustrating a representation of an example of a memory device according to an embodiment.

Referring to FIG. 2, the memory device 1100 may include a memory cell array 100, a peripheral circuit 200, a pulse generator 300 and an internal power supply circuit 400.

The memory cell array 100 may include a plurality of memory blocks suitable for storing data.

The peripheral circuit 200 may be suitable for programming data into the memory cell array 100, or reading or erasing the programmed data. For example, the peripheral circuit 200 may include a voltage generating circuit 200A, a row decoder 200B, a column decoder 200C and a data input/output circuit 200D.

The voltage generating circuit 200A may generate operation voltages Vop for a program operation, a read operation, or an erase operation in response to an operation signal OP.

The row decoder 200B may transmit the operation voltages Vop to a selected memory block among the memory blocks included in the memory cell array 100 in response to a row address RADD. For example, the row decoder 200B may transfer the operation voltages Vop to word lines WL connected to the selected memory block.

The column decoder 200C may exchange data with the memory cell array 100 through bit lines BL in response to a column address CADD and exchange data with the data input/output circuit 200D through column lines CL.

The data input/output circuit 200D may exchange data with the column decoder 200C through the column lines CL and exchange data with the external device through global data lines GDL<n:0> (i.e., n may be a natural number). Further, the data input/out circuit 200D may temporarily store a current data group DATA_C used for a current operation and a previous data group DATA_P used for a previous operation, and may transfer the current data group DATA_C and the previous data group DATA_P to the pulse generator 300.

The pulse generator 300 may output the operation signal OP, the row address RADD and the column address CADD in response to the command and address received from the control unit 1200 illustrated in FIG. 1. Particularly, the pulse generator 300 may receive the current data group DATA_C and the previous data group DATA_P from the data input/output circuit 200D, and generate main pulse data MP<k:0> (i.e., k may be a natural number) according to a data variation.

The internal power supply circuit 400, may convert an external power VCCE provided from the external device into an internal power VCCI according to the main pulse data MP<k:0> and supply the internal power VCCI to the inside of the memory device 1100. For example, the peripheral circuit 200 and the pulse generator 300 may operate with the received internal power VCCI.

Among the above-described devices, the data input/output circuit 200D and the pulse generator 300 to generate the stable internal power VCCI are described below.

Figure 3:
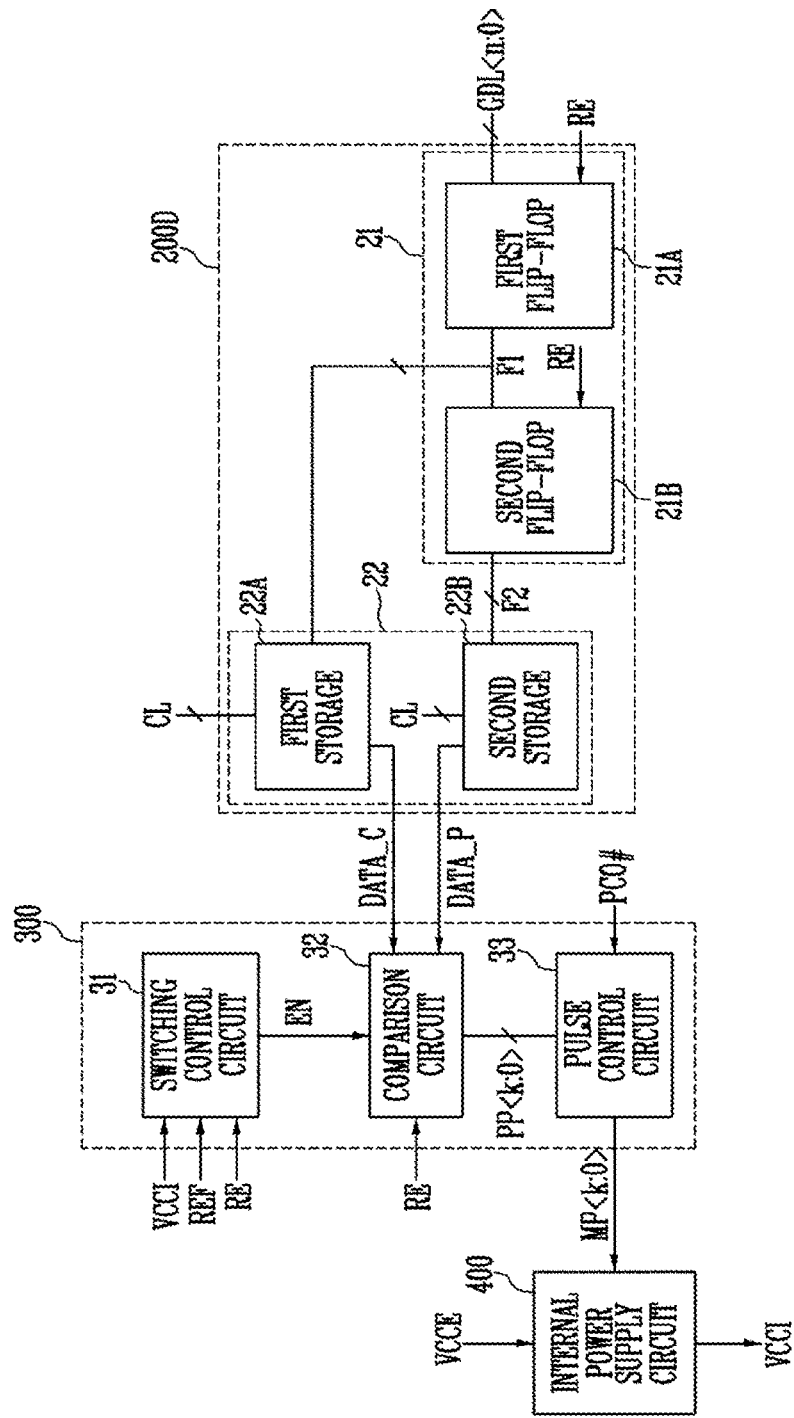
FIG. 3 is a diagram illustrating a representation of an example of a pulse generator and a data input/output path in FIG. 2.

FIG. 3 is a diagram illustrating a representation of an example of a pulse generator and a data input/output circuit 200D in FIG. 2.

Referring to FIG. 3, in the data input/output circuit 200D, a device which outputs the data stored in the memory device 1100 to an external device is illustrated. The data input/output circuit 200D may include a multiplexer (mux) 21 and a storage 22. The mux 21 may output the data received from the storage 22 through a first and second lines F1 and F2. The external device may be the control unit 1200 included in the memory system 1000. The storage 22 may temporarily store the received data from the column lines CL and subsequently transfer the data to the mux 21 through the first and second lines F1 and F2.

The mux 21 and the storage 22 are respectively described below.

The mux 21 may include a first flip-flop 21A and a second flip-flop 21B. During a read operation, the first flip-flop 21A may output the data to global data lines GDL<n:0> (i.e., where n may be a natural number) in response to the data received through the first line F1 and a control clock RE. The second flip-flop may output the data to the first line F1 in response to the data received through the second line F2 and the control clock RE.

The storage 22 may include a first storage 22A and a second storage 22B. During a read operation, the first storage 22A and the second storage 22B may temporarily store the data received through the column lines CL. The first storage 22A and the second storage 22B may selectively operate. For example, the first storage 22A may temporarily store the data (hereinafter, referred to as a current data group) used for the ongoing read operation, and the second storage 22B may temporarily store the data (hereinafter, referred to as a previous data group) used for the previous read operation.

Accordingly, the second flip-flop 21B may output the data to the first line F1 in response to the previous data group DATA_P received through the second line F2 and the control clock RE, and the first flip-flop 21A may output the data to global data lines GDL<n:0> in response to the data received through the first line F1 and the control clock RE, or output the data to the global data lines GDL<n:0> in response to the current data group DATA_C received through the first line F1 and the control clock RE.

Further, the first storage 22A and the second storage 22B may transfer the current data group DATA_C and the previous data group DATA_P to a comparison circuit 32 of the pulse generator 300.

The pulse generator 300 may measure a data variation by comparing by the current data group DATA_C with the previous data group DATA_P and generate the main pulse data MP<k:0> (i.e., K may be a natural number) to stably generate the internal power according to the measured data variation. The pulse generator 300 may include a switching control circuit 31, the comparison circuit 32 and a pulse control circuit 33.

The switching control circuit 31 may operate according to the control clock RE, compare the internal power VCCI with a reference voltage REF, and output a comparison enable signal EN upon the result of comparison. For example, the switching control circuit 31 may activate the comparison enable signal EN when the internal voltage VCCI is lower than the reference voltage REF, and deactivate the comparison enable EN when the internal voltage VCCI is higher than the reference voltage REF.

The comparison circuit 32 may operate according to the control clock RE and measure a data variation by comparing the current data group DATA_C with the previous data group DATA_P. The comparison circuit 32 may output a pre-pulse data (PP<k:0>; k is a positive integer) in response to the comparison enable signal EN. The pre-pulse data PP<k:0> may vary depending on the measured data variation.

The pulse control circuit 33 may control the pulse width of the pre-pulse data PP<k:0> according to a reference current option signal PCO# and output the data with the controlled pulse width as the main pulse data MP<k:0>. The reference current option signal PCO# may be as an option to uniformly control the current characteristics of the switches which may be different according to the manufacturing process of the memory device 1100 illustrated in FIG. 1, the reference current option signal PCO# may be set prior to manufacturing the memory device 1100. Accordingly, the reference current option signal PCO# may be set differently according to the memory device 1100. The main pulse data MP<k:0> may be transferred to the internal power supply circuit 400.

The internal power supply circuit 400 may output the internal power VCCI by controlling the level of external power VCCE supplied from the external device according to the main pulse data MP<k:0>.

Figure 4:
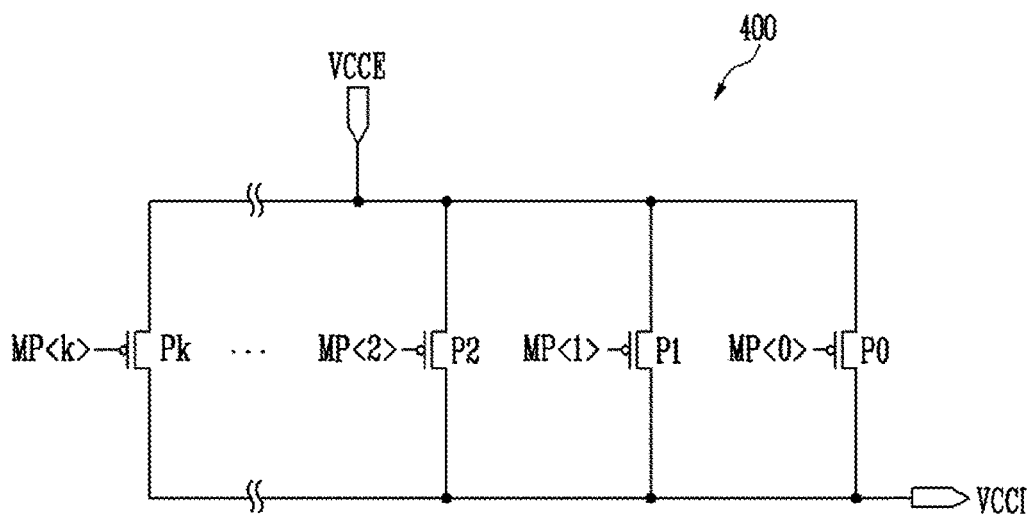
FIG. 4 is a circuit diagram illustrating a representation of an example of an internal power supply circuit.

FIG. 4 is a circuit diagram illustrating a representation of an example of an internal voltage supply circuit illustrated in FIG. 2.

Referring to FIG. 4, the internal power supply circuit 400 may include a plurality of switches P0 to Pk arranged in parallel between a terminal to which the external power VCCE is applied and a terminal to which the internal power VCCI is applied. The switches P0 to Pk may be embodied as, for example but not limited to, a PMOS transistor, and the main pulse data MP<k:0> may be applied to gates.

In an embodiment, zeroth main pulse data MP<0> may be applied to a gate of a zeroth switch P0, and first main pulse data MP<1> may be applied to a gate of a first switch P1, and a second main pulse data MP<2> may be applied to a gate of a second switch P2. In this way, a kth main pulse data MP<k> may be applied to a gate of a kth switch Pk.

For example, when the zeroth to first main pulse data MP<1:0> is applied to the internal power supply circuit 400, the zero and first switches P0 and P1 may be turned on, and the second to kth switches P2 to Pk may be turned off. When the external power VCCE is applied to drains of the turned on switches, the internal power VCCI having a low voltage level may be output to sources of the turned-on switches due to threshold voltage of the switches.

Accordingly, the internal power VCCI having a voltage level used in the memory device 1100 illustrated in FIG. 2. may be output.

An example of an internal power control method is described based on the above memory device 1100 below.

Figure 5:
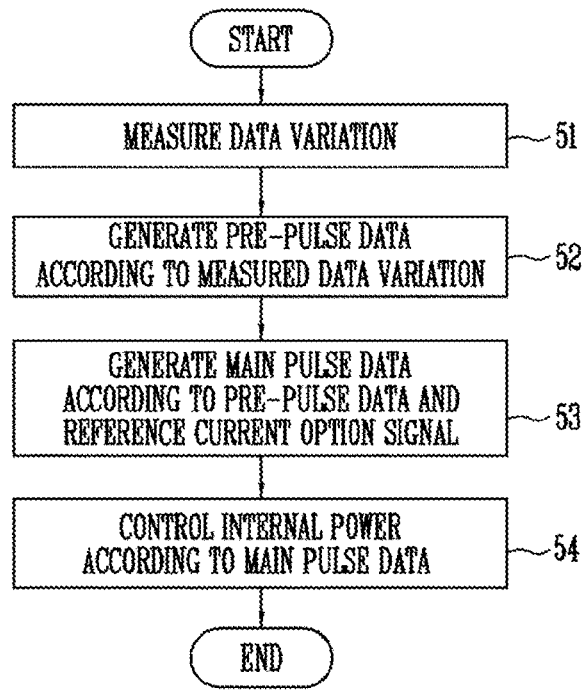
FIG. 5 is a flow chart illustrating a representation of an example of an internal power control method according to an embodiment.

FIG. 5 is a flowchart illustrating a representation of an example of an internal power control method according to an embodiment.

Referring to FIG. 5, the pulse generator 300 illustrated in FIG. 3 may measure data variation 51 by comparing the current data group DATA_C received from the data input/output circuit 200D illustrated in FIG. 3 and the previous data group DATA_P.

When the data variation is measured, the pulse generator 300 may generate pre-pulse data 52 according to the measured data variation. The pulse generator 300 may generate main pulse data 53 according to the reference current option signal PCO#. The internal power supply circuit 400 may control 54 the internal power to be output stably according to the main pulse data.

The operation method for respective devices to perform the above operation is described below.

Figure 6:
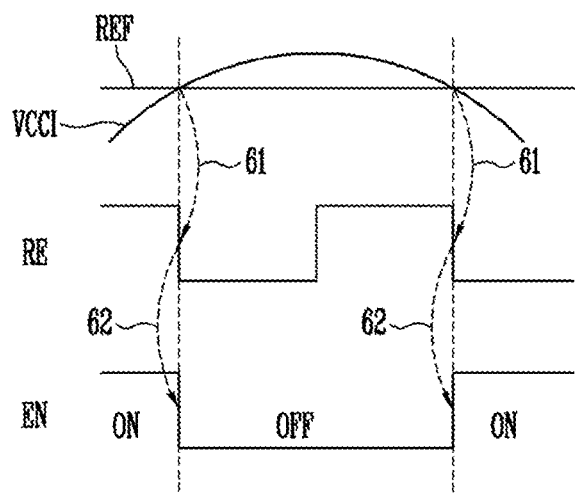
FIG. 6 is a diagram illustrating a representation of an example of operations of a switching control circuit.

FIG. 6 is a diagram illustrating a representation of an example of a switching control circuit operation illustrated in FIG. 3.

Referring to FIG. 6, the switching control circuit 31 illustrated in FIG. 3 may compare the internal power VCCI with a reference power REF. When the internal power VCCI gets higher than the reference power REF, the comparison enable signal EN may transition to a low level in synchronization with a falling edge of the control clock RE. While the internal power VCCI is lower than the reference power REF, the control clock RE may have a constant cycle. When the internal power VCCI gets lower than the reference power REF, the comparison enable signal EN may transition to a low level in synchronization with the falling edge of the control clock RE. When the internal power VCCI is lower than the reference power REF, the comparison enable signal EN may be activated (ON), and when the internal power VCCI is higher than the reference power REF, the comparison enable signal EN may be deactivated (OFF).

Figure 7:
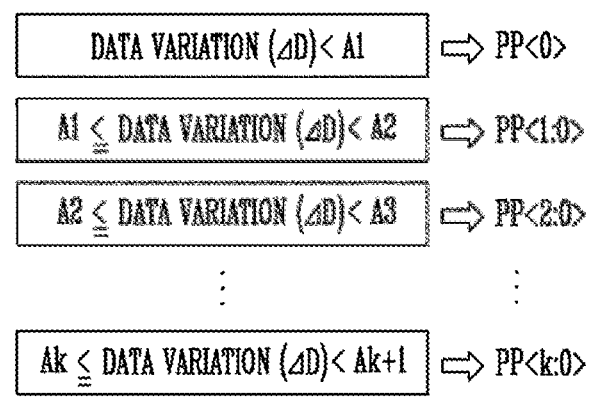
FIG. 7 is a diagram illustrating a representation of an example of operations of a comparison circuit.

FIG. 7 is a diagram illustrating a representation of an example of a comparison circuit operation in FIG. 3.

Referring to FIG. 7, the comparison circuit 32 illustrated in FIG. 3 may measure a data variation ΔD by comparing the current data group DATA_C illustrated in FIG. 3 with the previous data group DATA_P illustrated in FIG. 3. The method for measuring the data variation ΔD may be embodied in different forms. For example, the method may comprise counting the number of changed data among the current data group DATA_C and the previous data group DATA_P or measuring the current difference between a line to which the current data group DATA_C is loaded and a line to which the previous data group DATA_P is loaded. When the data variation ΔD is lower than a first critical amount A1, the comparison circuit 32 may output zeroth pre-pulse data PP<0>.

When the data variation ΔD is higher than the first critical amount A1 and lower than a second critical amount A2, the comparison circuit 32 may output zeroth and first pre-pulse data PP<1:0>. When the data variation ΔD is higher than the second critical amount A2 and lower than a third critical amount A3, the comparison circuit 32 may output zeroth to second pre-pulse data PP<2:0>. When the data variation ΔD is higher than a kth critical amount Ak and lower than a (k+1)th critical amount Ak+1, the comparison circuit 32 may output zeroth to kth pre-pulse data PP<k:0>.

The first or (k+1)th critical amounts A1 to Ak+1 may be set differently according to the memory device 1100 illustrated in FIG. 2 and stored in the storages included in the memory device 1100. The number of turned-on switches among the switches included in the internal power supply circuit 400 illustrated in FIG. 4, is determined by the pre-pulse data PP<k:0> output from the comparison circuit 32.

Figure 8:
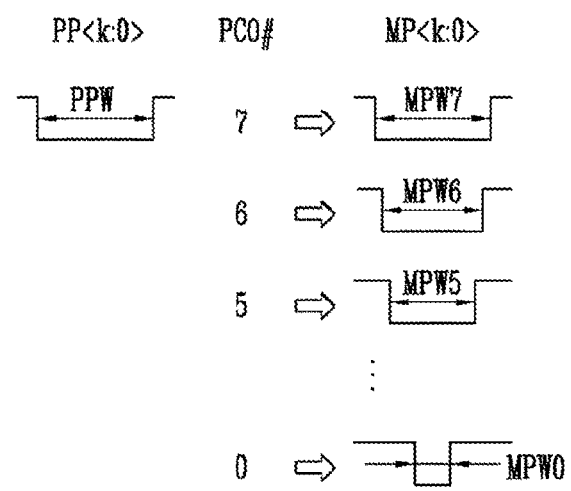
FIG. 8 is a diagram illustrating a representation of an example of operations of a pulse control circuit.

FIG. 8 is a diagram illustrating a representation of an example of a pulse control circuit operation illustrated in FIG. 3.

Referring to FIG. 8, the pulse control circuit 33 illustrated in FIG. 3 may control duration of the pre-pulse data PP<k:0> output from the comparison circuit 32 illustrated in FIG. 3. For example, the pulse control circuit 33 illustrated in FIG. 3 may control the width of a low pulse of the pre-pulse data PP<k:0> and the controlled data may be output as the main pulse data MP<k:0>. The reference current option signal PCO# may be used. The reference current option signal PCO# is information to compensate the current difference of elements which may occur while the memory device 1100 illustrated in FIG. 1 is manufactured. This information may be stored as data in the temporary storage included in the memory device 1100, and the pulse control circuit 33 may output a signal corresponding to the data stored in the memory device 1100. This signal is referred to as the reference current option signal PCO#. Accordingly, the reference current option signal PCO # may be output as a different signal according to the stored data. For example, when a zeroth reference current option signal PCO0 is output, the pulse control circuit 33 may control a width PPW of the pre-pulse data PP<k:0 to a zeroth main pulse width MPW0. When a fifth reference current option signal PCO5 is output, the pulse control circuit 33 may control the width PPW of the pre-pulse data PP<k:0 to a fifth main pulse width MPW5, when a sixth reference current option signal PCO6 outputs, the pulse control circuit 33 may control the width PPW of the pre-pulse data PP<k:0 to a sixth main pulse width MPW6, and when a seventh reference current option signal PCO7 outputs, the pulse control circuit 33 controls the width PPW of the pre-pulse data PP<k:0 to a seventh main pulse width MPW7. The number of reference current option signals PCO # may be set differently according to the memory device 1100.

Figure 9:
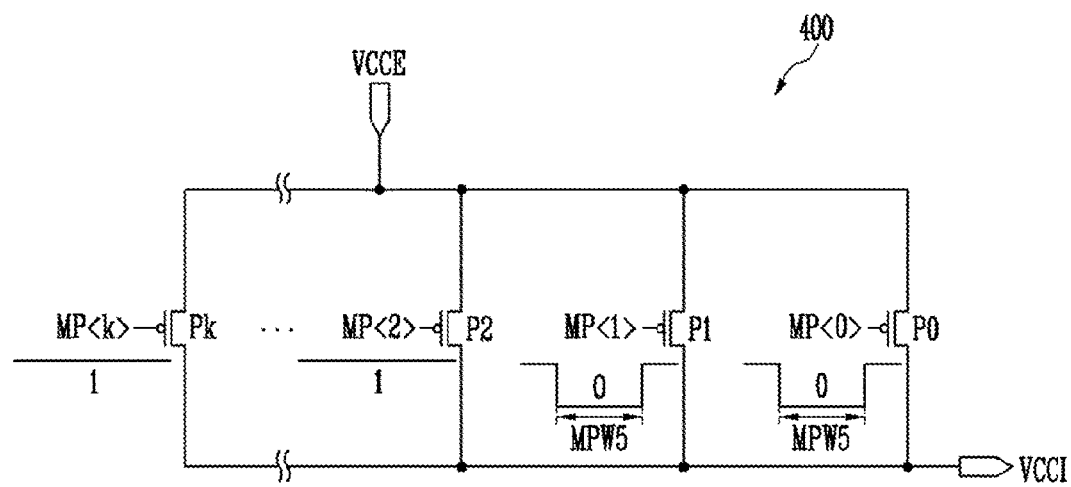
FIG. 9 is a diagram illustrating a representation of an example of operations of an internal power supply circuit.

FIG. 9 is a diagram illustrating a representation of an example of the operation of an internal power supply circuit illustrated in FIG. 3.

Referring to FIG. 9, the internal power supply circuit 400 may be configured in substantially the same manner as the internal power supply circuit 400 illustrated in FIG. 4. Thus, like descriptions thereof will be omitted. The internal power supply circuit 400 may include the zeroth to kth switches P0 to Pk, and the zeroth to kth switches P0 to Pk may be turned on or off according to the main pulse data MP<k:0>. For example, when the zeroth and first main pulse data MP<0> and MP<1> including the fifth main pulse width MPW5 are received, a zeroth and first switches P0 and P1 may be turned on during a time corresponding to the fifth main pulse width MPW5. At this time, the rest of the switches P2 to Pk may be turned off. When the zero and first switches P0 and P1 are turned on, the external power VCCE may be output to the internal power VCCI through the zeroth and first switches P0 and P1.

As described above, when performing the operation with high current consumption, such as the operation with a high data variation, the comparison circuit 32 may output the pre-pulse data PP<k:0> to turn on the plurality of switches P0 to Pk included in the internal power supply circuit 400, and output the main pulse data MP<k:0> whose pulse width is controlled so that the internal power VVCI may be supplied to the memory device 1100. Therefore, the internal power supply circuit 400 may stably supply the internal power VCCI to the memory device 1100. Further, the above devices may apply to the various embodiments operating with the supplied internal power VCCI in addition to the memory device 1100.

According to various embodiments, the internal power may be stably supplied to the memory device although instant power consumption increases in the memory device. Accordingly, the reliability of the memory device may be improved and the reliability of the memory system having the memory device may be improved.

What is claimed is:
1. A pulse generator, comprising:
   a switching control circuit suitable for comparing an internal power with a reference voltage and outputting a comparison enable signal according to a result of the comparison;
   a comparison circuit suitable for measuring a data variation by comparing a current data group and a previous data group, and outputting pre-pulse data in response to the data variation and the comparison enable signal; and
   a pulse control circuit suitable for outputting main pulse data by controlling a pulse width of the pre-pulse data.

2. The pulse generator of claim 1, wherein the switching control circuit outputs the comparison enable signal having a low level when the internal power is higher than the reference voltage, and outputs the comparison enable signal having a high level when the internal power is lower level than the reference voltage.

3. The pulse generator of claim 1, wherein the comparison circuit outputs the pre-pulse data by controlling a number of the pulses according to the data variation.

4. The pulse generator of claim 1, wherein the pulse control circuit outputs the main pulse data by controlling the pulse width of the pre-pulse data according to a reference current option signal.

5. The pulse generator of claim 4, wherein the reference current option signal to control current characteristics of switches included in a memory device and the reference current option signal is set according to the memory device.

6. The pulse generator of claim 1, further comprising an internal power supply circuit suitable for outputting the internal power in response to the main pulse data.

7. The pulse generator of claim 6, wherein the internal power supply circuit includes a plurality of switches arranged in parallel between a terminal to which an external power is applied and a terminal to which the internal power is applied.

8. The pulse generator of claim 7, wherein the switches include a plurality of PMOS transistors turned on or off in response to the main pulse data.

9. A memory device, comprising:
a memory cell array suitable for storing data;
a peripheral circuit suitable for performing a program operation, a read operation or an erase operation on the memory cell array and temporarily storing a first data group and second data groups;
a pulse generator suitable for measuring a data variation by comparing the first data group with the second data group and outputting a main pulse data with a pulse number and a pulse width controlled according to a data variation; and
an internal power supply circuit suitable for outputting an internal power according to the main pulse data.

10. The memory device of claim 9, wherein the peripheral circuit comprises:
a voltage generating circuit suitable for generating operation voltages for the read operation or the erase operation in response to an operation signal;
a row decoder suitable for transmitting the operation voltages to a selected memory block among memory blocks included in the memory cell array in response to a low address;
a column decoder suitable for exchanging data with the memory cell array through bit lines coupled to the memory cell array in response to a column address; and
a data input/out circuit suitable for exchanging data with the column decoder through column lines, exchanging data from an external device through global data lines, and storing the first data group and the second data group.

11. The memory device of claim 10, wherein the data input/output circuit comprises:
a mux coupled to the global data lines; and
a storage coupled between the column lines and the mux and suitable for storing the first data group and the second data group.

12. The memory device of claim 11, wherein the storage comprises:
a first storage suitable for temporarily storing the first data group; and
a second storage suitable for temporarily storing the second data group.

13. The memory device of claim 9, wherein the pulse generator comprises:
a switching control circuit suitable for comparing the internal power with a reference voltage and outputting a comparison enable signal according to a result of comparison;
a comparison circuit suitable for measuring data variation by comparing the first data group with the second data group and outputting a pre-pulse data according to the data variation and the comparison enable signal; and
a pulse control circuit suitable for outputting the main pulse data by controlling the pulse width of the pre-pulse data.

14. The memory device of claim 13, wherein the switching control circuit is suitable for outputting the comparison enable signal at a low level when the internal power is higher than the reference voltage, and outputting the comparison enable signal at a high level when the internal power is lower than the reference voltage.

15. The memory device of claim 13, wherein the comparison circuit is suitable for outputting the pre-pulse data by controlling a number of pulses according to the data variation.

16. The memory device of claim 13, wherein the comparison circuit is suitable for outputting the pre-pulse data by controlling the pulse number according to a reference current option signal.

17. The memory device of claim 16, wherein the reference current option signal to uniformly control current characteristics of switches included in the memory device and the reference current option signal is set according to the memory device.

18. The memory device of claim 9, wherein the internal power supply circuit includes a plurality of switches arranged in parallel between a terminal to which the external power is applied from an external device of the memory device and a terminal to which the internal power is output.

19. The memory device of claim 18, wherein the switches comprise a plurality of transistors turned on or off in response to the main pulse data.

20. The memory device of claim 9, wherein the first data group includes data used for a current operation, and the second data group includes data used for a previous operation.

21. A memory system, comprising:
a memory device suitable for converting an external power into an internal power, operating with the internal power and storing data; and
a control unit suitable for controlling the memory device;
wherein the memory device comprises:
a memory cell array suitable for storing the data;
a peripheral circuit suitable for performing a program operation, a read operation or an erase operation on the memory cell array and temporarily storing a current data group and a previous data group;
a pulse generator suitable for measuring a data variation by comparing the first data group with the second data group and outputting main pulse data with a controlled pulse number and pulse width according to the data variation; and
an internal power supply circuit suitable for outputting the internal power according to the main pulse data.

22. A method of controlling an internal power of a memory device, the method comprising:
comparing an internal power with a reference voltage and output a comparison enable signal according to a result of the comparison by a switching control circuit;
measuring a data variation by comparing a current data group and a previous data group, and output pre-pulse data in response to the data variation and the comparison enable signal;
outputting main pulse data by controlling a pulse width of the pre-pulse data; and outputting the internal power in response to the main pulse data.

\* \* \* \* \*